(12) United States Patent
Hahn et al.

(10) Patent No.: US 11,999,098 B2
(45) Date of Patent: Jun. 4, 2024

(54) PARALLELIZED 3D LITHOGRAPHY USING MULTI-BEAM, MULTI-COLOR LIGHT-INDUCED POLYMERIZATION

(71) Applicant: Karlsruher Institut für Technologie, Karlsruhe (DE)

(72) Inventors: Vincent Hahn, Karlsruhe (DE); Patrick Müller, Karlsruhe (DE); Eva Blasco, Karlsruhe (DE); Martin Wegener, Karlsruhe (DE)

(73) Assignee: Karlsruher Institut für Technologie, Karlsruher (DE)

( * ) Notice: Subject to any disclaimer, the term of this patent is extended or adjusted under 35 U.S.C. 154(b) by 388 days.

(21) Appl. No.: 17/413,357

(22) PCT Filed: Oct. 21, 2019

(86) PCT No.: PCT/EP2019/078557
§ 371 (c)(1),
(2) Date: Jun. 11, 2021

(87) PCT Pub. No.: WO2020/126154
PCT Pub. Date: Jun. 25, 2020

(65) Prior Publication Data
US 2022/0055290 A1  Feb. 24, 2022

(30) Foreign Application Priority Data

Dec. 17, 2018 (DE) .......... 102018009916.5

(51) Int. Cl.
*B29C 64/129* (2017.01)
*B29C 64/245* (2017.01)
(Continued)

(52) U.S. Cl.
CPC .......... *B29C 64/129* (2017.08); *B29C 64/245* (2017.08); *B29C 64/255* (2017.08);
(Continued)

(58) Field of Classification Search
None
See application file for complete search history.

(56) References Cited

U.S. PATENT DOCUMENTS

| | | | |
|---|---|---|---|
| 4,041,476 A | 8/1977 | Swainson | |
| 4,571,377 A | 2/1986 | McGinniss et al. | |

(Continued)

FOREIGN PATENT DOCUMENTS

| | | |
|---|---|---|
| EP | 3208075 A1 | 8/2017 |
| WO | 2006109355 A1 | 10/2006 |
| WO | 2017104368 | 6/2017 |

OTHER PUBLICATIONS

Jiang, C-P., "Development of a Novel Two-Laser Beam Stereolithography System", Rapid Prototyping Journal, 2011, vol. 17(2), pp. 148-155.

(Continued)

*Primary Examiner* — Yung-Sheng M Tsui
(74) *Attorney, Agent, or Firm* — McDonnell Boehnen Hulbert & Berghoff LLP

(57) ABSTRACT

The present invention relates to a method for additive manufacturing of a 3D-structured form and to a device for additive manufacturing of a 3D-structured form.

13 Claims, 4 Drawing Sheets

(51) Int. Cl.
  *B29C 64/255* (2017.01)
  *B29C 64/273* (2017.01)
  *B29C 64/282* (2017.01)
  *B33Y 10/00* (2015.01)
  *B33Y 30/00* (2015.01)
(52) U.S. Cl.
  CPC .......... *B29C 64/273* (2017.08); *B29C 64/282* (2017.08); *B33Y 10/00* (2014.12); *B33Y 30/00* (2014.12)

(56) References Cited

U.S. PATENT DOCUMENTS

| | | | |
|---|---|---|---|
| 9,453,142 B2* | 9/2016 | Rolland | C08G 18/8175 |
| 2003/0013047 A1* | 1/2003 | Tani | B29C 64/135 |
| | | | 430/394 |
| 2016/0067921 A1 | 3/2016 | Willis et al. | |
| 2017/0225393 A1* | 8/2017 | Shkolnik | B33Y 10/00 |
| 2018/0257297 A1* | 9/2018 | Matheu | A61L 27/26 |
| 2019/0047224 A1* | 2/2019 | Trautmann | B33Y 10/00 |
| 2019/0084241 A1* | 3/2019 | Krishnaswamy | B29C 64/268 |
| 2020/0108557 A1* | 4/2020 | Lippert | B29C 64/393 |

OTHER PUBLICATIONS

German Examination Report from the German Patent Office, dated Jul. 23, 2019, for Application No. 102018009916.5, pp. 1-10.
German PCT International Search Report, from the International Searching Authority, dated Feb. 25, 2020, for International Application No. PCT/EP2019/078557, pp. 1-15.

* cited by examiner

PARALLELIZED 3D LITHOGRAPHY USING MULTI-BEAM, MULTI-COLOR LIGHT-INDUCED POLYMERIZATION

CROSS-REFERENCE

This application is a 371 U.S. national phase of PCT/EP2019/078557, filed Oct. 21, 2019, which claims priority from DE patent application no. 102018009916.5, filed Dec. 17, 2018, both which are incorporated by reference in its entirety.

FIELD OF THE INVENTION

The present invention relates to a method for additive manufacturing of a 3D-structured form and to a device for additive manufacturing of a 3D-structured form.

BACKGROUND OF THE INVENTION

One current variant for fabricating 3D-printed forms is light-induced polymerization (photopolymerization). In this case, a liquid photoresist is hardened by irradiating with light. Unexposed regions remain liquid and are washed out during a developing step.

The basic requirement for fabricating 3D-structured forms in this case is that the photoresist can be spatially selectively hardened. Several solutions have become established for this. For example, two-photon lithography is used for structure sizes in the micrometer range. With this lithography method, a long-wave high-powered laser is focused into the liquid photoresist. Since the photoresist is for the most part transparent to the laser, polymerization occurs only directly in focus. There, intensities which are great enough to harden the photoresist by means of two-photon absorption are achieved. These high intensities are typically achieved with ultrashort-pulse lasers. In order to expose entire volumes, the focused laser is rasterized in the liquid photoresist.

One disadvantage of this method is the lack of parallelization. Individual image points are exposed in series. The reasons for this are mainly twofold: if a plurality of laser focuses are generated closely together, as is necessary for parallelization, superposition of adjacent laser beams occurs on the other side of the focal plane as well. There too, intensities which are sufficient to harden the photoresist are achieved. As a result, the necessary spatial selectivity for fabricating a structured form in a 3D printing process is lost. Furthermore, the power requirements for the laser become so great that they can only be achieved at a high technical cost.

SUMMARY OF THE INVENTION

The object of the present invention is therefore to provide a method and a device which make possible parallelized 3D printing for structure sizes in the micrometer range, starting from a liquid photoresist.

This object is achieved by the embodiments characterized in the claims.

Figure 1:
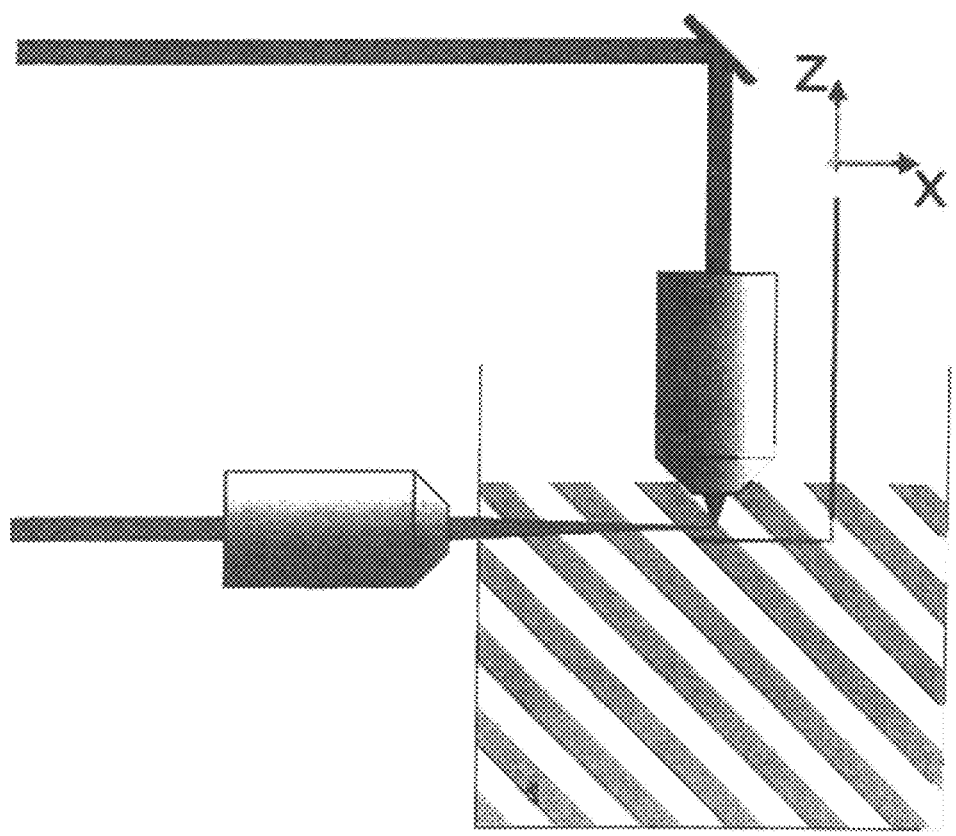
FIG. 1 shows an example of the method for additive manufacturing according to the invention and of the device for additive manufacturing according to the invention.

LIST OF REFERENCE NUMERALS 1 piezo-stage
2 digital camera
3 440 nm laser (continuous-wave)
4 640 nm laser (continuous-wave)
5 acousto-optic modulator

DETAILED DESCRIPTION OF THE INVENTION

A first aspect of the invention relates to a method for additive manufacturing of a 3D-structured form, comprising these steps in the following sequence:
  i) providing a liquid photoresist, comprising at least one monomer and at least one photoinitiator system,
  ii) irradiating the liquid photoresist with a first light source at a first wavelength $\lambda_1$ and with a second light source at a second wavelength $\lambda_2$,
  wherein $\lambda_1 \neq \lambda_2$, and
  hardening of the liquid photoresist to form the 3D-structured form takes place only at the position which is irradiated by the first light source and the second light source with a time interval of less than 1 ms.

The present invention makes possible advantageous parallelized fabrication of a 3D-structured form, since the hardening of the photoresist takes place only at the position which is irradiated by the first light source and the second light source with a time interval of less than 1 ms. Preferably this position corresponds to the focal plane of at least one of the first light source and the second light source.

According to the present invention, the hardening of the liquid photoresist to form the 3D-structured form takes place only at the position which is irradiated by the first light source and the second light source with a time interval of less than 1 ms. In one embodiment, the first light source and the second light source irradiate the liquid photoresist sequentially with a time interval of less than 1 ms, preferably less than 1 µs. In a further embodiment, the first light source and the second light source irradiate the liquid photoresist simultaneously.

According to the invention, a "method for additive manufacturing" (i.e. "additive method") is to be understood to mean a method in which the 3D-structured form is built up in steps by hardening the liquid photoresist. The method for additive manufacturing according to the invention is to be distinguished from a method for subtractive manufacturing (i.e. "subtractive method"), in which material is removed from a form.

One embodiment of the method for additive manufacturing in accordance with the present invention is shown in FIG. 1. The liquid photoresist, which is represented as a grey striped area, is irradiated with a first light source at a first wavelength $\lambda_1$ and with a second light source at a second wavelength $\lambda_2$.

The 3D-structured form in accordance with the present invention is not particularly limited. Owing to the fact that the hardening of the photoresist takes place only at the position which is irradiated by the first light source and by the second light source with a time interval of less than 1 ms, structurings smaller than 10 µm, preferably smaller than 1 µm, can be produced. The minimum achievable structure size is not particularly limited. In one embodiment, the structuring has a size of at least one-tenth of the wavelength of the light sources used.

The 3D-structured form may for example be a prosthesis, a cell template with controlled microstructuring or a metamaterial, or be used in microoptics and microfluidics.

Step i) of providing the liquid photoresist, comprising at least one monomer and at least one photoinitiator system, in accordance with the present invention is not particularly limited.

In one embodiment, the liquid photoresist in step i) is provided in a container. According to one embodiment, the container is a glass vessel or a plastics-material vessel which is optically transparent to the wavelengths used. Alternatively, a non-transparent container which has suitable openings for imaging lenses may be used. According to one embodiment, the container encloses a volume which is greater than the 3D-structured form which is to be printed or a segment thereof. According to one embodiment of the present invention, a substrate which supports the fabricated 3D-structured form is located in the container.

In a further embodiment, the liquid photoresist can be provided without a container, directly on the substrate. This embodiment can for example be used if the direction of irradiation of the first light source is identical to the direction of irradiation of the second light source. In this case, the substrate in this embodiment may be a transparent area.

Preferably the substrate is a stage or mounted on a stage which can be moved in the axial direction at least along the z-axis. The z-axis is the axis which runs perpendicularly to the layers which are built up in one embodiment in the method for additive manufacturing. According to a further embodiment, the stage is movable in the direction of the x-, y- and z-axis. Owing to the additional mobility of the stage laterally in the x and y directions, large structures can also be fabricated, since the laterally limited image field of commercially available lenses can be overcome.

According to one preferred embodiment, the 3D-structured form is built up in layers along the z-axis. In this case, preferably the stage is moved in the z direction.

In the present invention, the first light source with the first wavelength $\lambda_1$ and the second light source with the second wavelength $\lambda_2$ are not particularly limited, as long as $\lambda_1 \neq \lambda_2$. Preferably, the wavelength of the first light source and of the second light source in each case is in a range between 190 nm and 900 nm. For example, a laser or an LED can be used as the light source. Preferably, a light source with a wavelength in the UV/Vis or infrared range is used as the first light source and second light source. More preferably, a laser is used as the first light source and as the second light source. The first wavelength Ai and the second wavelength $\lambda_2$ are dependent on the choice of photoinitiator system.

According to one further embodiment, the first light source and the second light source are lasers, with at least one of the lasers being a pulsed laser. In the present invention, a "pulsed laser" is to be understood to mean a laser which emits radiation in chronologically discrete pulses. If no pulsed laser is used as a laser, the laser is a continuous-wave laser. A "continuous-wave laser" is a continuously-excited laser. In one embodiment, both light sources are pulsed lasers. The pulse duration, pulse repetition rate, duration of irradiation and irradiation rate in this case are not particularly limited, and can be selected to suit the lives of the states of the photoinitiator system. By using a suitably pulsed laser, spatially selective hardening can therefore be achieved particularly easily.

The arrangement of the first light source and the second light source relative to each other in accordance with the present invention is not particularly limited, as long as the first light source and the second light source can irradiate the photoresist, so that the photoresist hardens at the position of irradiation by the first light source and the second light source with a time interval of less than 1 ms. Thus the direction of irradiation of the first light source and of the second light source may be identical or different.

In one embodiment, the direction of irradiation of the first light source is identical to the direction of irradiation of the second light source. A device with such an orientation of the first light source and of the second light source can be produced without high apparatus costs.

Preferably, in the present invention the direction of irradiation of the first light source is different from the direction of irradiation of the second light source. Due to this different spatial arrangement of the first light source and the second light source, the spatial selectivity of the hardening of the photoresist can be achieved particularly easily.

According to one embodiment of the present invention, the direction of irradiation of the first light source relative to the direction of irradiation of the second light source with respect to the focal plane of the two light sources is at an angle in a range from 45° to 135°, preferably from 60° to 120°, particularly preferably from 80° to 100°. Particularly advantageous spatial selectivity of the hardening of the photoresist can be obtained by such an angle.

Corresponding to one embodiment of the method according to the invention, in step ii) the 3D-structured form to be produced is imaged into at least one of the focal planes of the first light source and of the second light source. In this case, for example micromirror devices can be used. These micromirror devices have short switching times of only a few microseconds. As a result, an individual plane in the photoresist can be exposed within microseconds. Alternatively, liquid-crystal displays can be imaged. These have switching times of several milliseconds.

The liquid photoresist in accordance with the present invention is not particularly limited as long as it comprises at least one monomer and at least one photoinitiator system and is present in a liquid state.

In one embodiment, the photoresist comprises from 70 wt. % to 99.99 wt. %, preferably from 85 wt. % to 99.5 wt. %, particularly preferably from 95 wt. % to 99 wt. %, of the at least one monomer and from 0.01 wt. % to 30 wt. %, preferably from 0.5 wt. % to 15 wt. %, particularly preferably from 1 wt. % to 5 wt. %, of the at least one photoinitiator system. The monomer and/or the photoinitiator system may also be present dissolved in a solvent, in which case the combination of monomer and solvent and photoinitiator system and solvent then corresponds in each case to the above-mentioned parts by weight. The choice of solvent is not particularly limited. A low-volatility and low-toxicity solvent, for example dimethyl sulfoxide, anisole or 2-propanol, is preferred.

The at least one monomer used in the present invention is not particularly limited, as long as it can be hardened by photopolymerization. The monomer may be monofunctional or multifunctional. In this case, "multifunctional" can mean bifunctional, trifunctional or a higher functionality than trifunctional. In the present invention, a monomer with only one type of functionality or a mixture of monomers of different functionalities can be used. Preferably at least one multifunctional monomer is used.

The one monomer may be at least one component of the group consisting of vinylpyrrolidone, acrylonitrile, (meth) acrylic acid, vinyl acetate, methyl(meth)acrylate, ethyl acrylate, (iso)butyl vinyl ether, vinyl butyrate, methyl acrylamide, isopropylacrylamide, tricyclo[$5.2.1.0^{2,6}$] decanedimethanol di(meth)acrylate, poly(ethylene glycol) di(meth)acrylate, bisphenol A-ethoxylate di(meth)acrylate, bis(acrylamide), pentaerythritol tri(meth)acrylate, trimethylolpropane tri(meth)acrylate, trimethylolpropane propoxylate tri(meth)acrylate, trimethylolpropane ethoxylate tri (meth)acrylate, glycerol propoxylate tri(meth)acrylate, di(tri-methylol propane) tetra(meth)acrylate, pentaerythritol tetra(meth)acrylate and dipentaerythritol (penta-/hexa)- (meth)acrylate.

The at least one photoinitiator system in accordance with the present invention is not particularly limited. According to the invention, the term "photoinitiator system" is understood to mean a system which only by the irradiation with the first light source at a first wavelength $\lambda_1$ and with the second light source at a second wavelength $\lambda_2$ with a time interval of less than 1 ms forms a radical which is capable of starting the polymerization of the at least one monomer of the liquid photoresist. The photoinitiator system comprises at least one photoinitiator. This may be present in the photoinitiator system directly as a compound or be synthesized in situ by reactants. In the present invention, a "photoinitiator" is to be understood to mean a compound which after absorption of radiation forms a radical which makes the hardening of the photoresist possible.

The photoinitiator system, after absorption of a first photon with the first wavelength $\lambda_1$ of the first light source, changes into a "dormant intermediate state". This intermediate state has hardly any or no hardening property. As a consequence of the absorption of a second photon with the second wavelength $\lambda_2 \neq \lambda_1$ of the second light source, a radical which can harden the at least one monomer is formed in the photoinitiator system. In this case, the first photon of the wavelength Ai and the second photon of the wavelength $\lambda_2$ can be absorbed by only one component of the photoinitiator system or by different components of the photoinitiator system.

The components of the photoinitiator system are not particularly limited as long as at least one photoinitiator is comprised therein. Furthermore, the photoinitiator system may comprise at least one component selected from a photosensitizer and a photoacid generator. According to the invention, a "photosensitizer" is understood to mean a compound which in the case of a light-induced reaction acts as an energy source or radical former for a photoinitiator.

According to one preferred embodiment, the dormant intermediate state returns to the ground state if no second photon of the second wavelength $\lambda_2$ is absorbed by the photoinitiator system. In one embodiment, the duration of the return to the ground state is less than 1 s and, more preferably, less than 1 ms. Owing to this short duration of the return to the ground state, the selective spatial hardening of the photoresist can be achieved particularly advantageously and rapid printing operations can be made possible.

Figure 2:
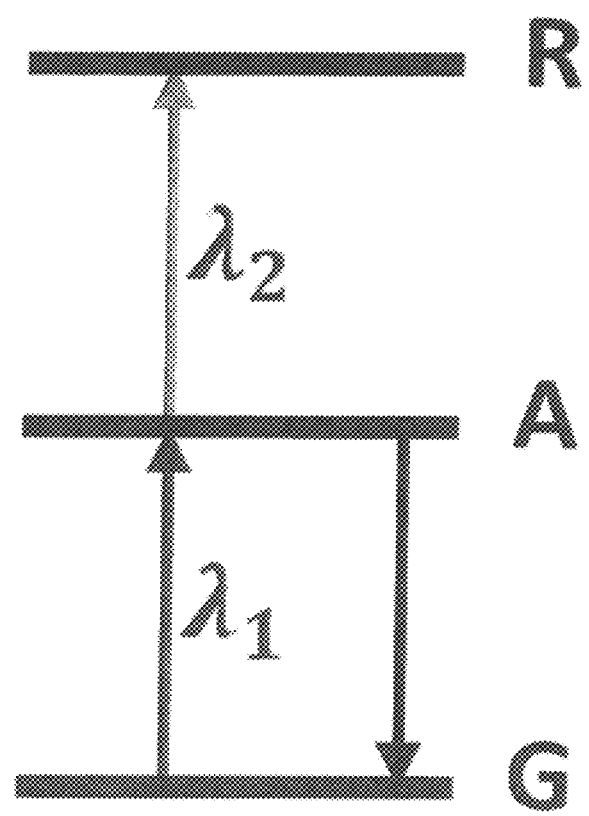
FIG. 2 shows a schematic representation of the energy levels of the photoinitiator system.

A schematic representation of the energy levels of the photoinitiator system is shown in FIG. 2. The dormant intermediate state is marked "A" and the hardening state is marked "R".

In one embodiment, the dormant intermediate state has at most a low absorption of a photon of the first wavelength $\lambda_1$. Preferably the dormant intermediate state has no absorption of a photon of the first wavelength $\lambda_1$. As a result, the spatial selectivity of the hardening of the photoresist can be improved.

The provision of the photoinitiator system in accordance with the present invention which hardens the photoresist is not particularly limited. In this case, in one embodiment at least one component which absorbs both the first photon of the wavelength $\lambda_1$ and the second photon of the wavelength $\lambda_2$ can be used. In a further embodiment, at least two components can be used, with at least one component absorbing the first photon of the wavelength $\lambda_1$ and at least one further component absorbing the second photon of the wavelength $\lambda_2$.

In this case, different mechanisms can be used depending on the components of the photoinitiator system.

According to one embodiment, the photoinitiator system comprises at least one of: 1) a compound with a high bond-breaking energy, 2) a compound with a photolabile protecting group, 3) an initiator photosynthesized in situ, 4) a photochromic compound, 5) a quencher and 6) a pH-sensitive photoinitiator.

1) Compound with High Bond-Breaking Energy

Typical photoinitiators operate by a photoinitiator module absorbing a photon in order to change from the ground state ($S_0$) into the one excited singlet state ($S_i$). By "intersystem crossing", the molecule can change into the triplet state ($T_i$). Starting from one of these two states ($S_i$ or $T_i$), radical formation occurs in photoinitiators by bond cleavage (Norrish type I reaction) or by abstraction of hydrogen (Norrish type II reaction).

Bond cleavage according to a Norrish type I or type II reaction can only take place if the energy necessary therefor is considerably less than the state energy of the compound. If this is not the case, bond cleavage and the associated radical formation are extremely unlikely. Below, examples of components of a photoinitiator system according to the invention which undergo bond cleavage in a Norrish type I or type II reaction are named.

In one embodiment, the photoinitiator system according to the above-mentioned mechanism 1) comprises at least one component of a group, consisting of an α-diketone, a naphthyl ester, carbazole, an oligothiophene, a p-phenyl benzoyl derivative, a phenyl phenacyl derivative and phenothiazine.

Examples of α-diketones which can be used in the present invention are benzil, diacetyl and camphorquinone.

Benzil undergoes a Norrish type I reaction once the molecule has been excited into a higher triplet state ($T_a$). This excitation can take place in steps if benzil is first of all optically excited into the triplet ground state ($T_1$). This excitation can be achieved with a wavelength of <440 nm. The $T_1$ state has an absorption band with a maximum at a wavelength of 480 nm. From this state, radicals can be formed.

Diacetyl in the ground state absorbs light of the wavelength <500 nm. In contrast to benzil, diacetyl however has the $T_1$-$T_n$ absorption band with an absorption maximum in the near-infrared range (>600 nm). It is advantageous that the absorption spectra of the $S_0$-$S_i$— and $T_1$-$T_n$ transitions scarcely overlap. However, with diacetyl in the $T_1$ state abstraction of hydrogen already takes place, as a result of which the $T_1$ state is depleted. This can be countered with a sufficiently high intensity of the near-infrared radiation source, as a result of which the $T_1$-$T_n$ transition is induced.

Camphorquinone Behaves Similarly to Diacetyl.

For some naphthyl esters, the energy level of the triplet ground state $T_1$ is about 250 kJ/mol. Such naphthyl esters are for example phenyl-1-naphthoate, phenyl-2-naphthoate, methyl-1-naphthoate, methyl-2-naphthoate, naphthalene-1-yl benzoate, naphthalene-2-yl benzoate, naphthalene-1-yl acetate and naphthalene-2-yl acetate. The energy necessary for bond cleavage is approximately 200 kJ/mol, depending on the exact molecule configuration. Nevertheless, bond cleavage from the $T_1$ state is not observed. The fact that no bond breakage from the $T_1$ state occurs is due to large energy barriers between the $T_1$ state and the state of the dissociated bond. Bond cleavage and associated radical formation can be observed from more-highly excited triplet states.

The naphthyl ester molecules may for example be converted indirectly into the $T_1$ state by exciting benzophenone as photosensitizer at 365 nm. Benzophenone, after optical excitation, changes with a very high degree of probability into the $T_1$ state via intersystem crossing and can convert other molecules into a triplet state by means of an energy transfer. The $T_1$ naphthyl esters can be optically excited at about 430 nm and converted into more-highly excited triplet states.

Carbazole, after step-wise absorption of two photons of different wavelengths, forms a carbazyl radical. The radical in the case of carbazole is formed from an excited singlet state. This is in contrast to the molecules previously mentioned, which generate radicals from the triplet state. Carbazole can be converted into the first excited singlet state with a wavelength of <365 nm. From there, a further excitation into more-highly excited singlet states can take place optically with a wavelength of >500 nm.

One example of an oligothiophene which has the above-mentioned properties is α-quinquethiophene. It can be excited into higher triplet states ($T_n$) in steps by irradiation with the first light source and with the second light source, breaking down into radicals from these states. In this case, for example a first laser with a wavelength of 420 nm and a second laser with a wavelength of 660 nm can be used. First of all, α-quinquethiophene is converted optically into a $T_n$ state. By way of an energy transfer, photosensitizers, which act as radical formers, can then be excited. For example, 3,3'-diazidodiphenyl sulfone (DZDS) and 2,2-dimethoxy-2-phenyl acetophenone can be used as radical formers.

P-phenyl benzoyl derivatives could be excited into the $T_1$ state with a photosensitizer, such as for example benzophenone. Examples of such p-phenyl benzoyl derivatives are 4-biphenyl carboxylic acid, methyl-4-biphenyl carboxylate, phenyl[1,1'-biphenyl]-4-carboxylate and 5-phenyl[1,1'-biphenyl]-4-carbothioate. By further excitation at a wavelength of 420 nm, bond breakage occurs, forming radicals. Benzophenone can be excited here at a wavelength of 355 nm.

Similar behavior as with the p-phenyl benzoyl derivatives can be observed with phenyl phenacyl derivatives. Examples of such p-phenyl benzoyl derivatives are 4-phenyl acetophenone, 2-bromo-4'-phenyl acetophenone, 2-chloro-4'-phenyl acetophenone, 1-(4-biphenyl)-2-hydroxyethanone, 1-[1,1'-biphenyl]-4-yl-2-methoxy-ethanone, 1-biphenyl-4-yl-2-phenoxy-ethanone, 1-[1,1'-biphenyl]-4-yl-2-sulfanyl-ethanone and 1-[1,1'-biphenyl]-4-yl-2-phenylsulfanyl-ethanone. With the aid of a photosensitizer, such as for example benzophenone, the phenyl phenacyl derivative can be excited into the $T_1$ state. By a further excitation at a wavelength of 440 nm, bond breakage occurs, forming radicals. Benzophenone can be excited here at 355 nm.

Phenothiazine, upon absorption of a photon of a first wavelength of 308 nm, can be excited into the $T_1$ state. By a further excitation at a wavelength of 480 nm, bond breakage occurs, forming radicals.

2) Compound with a Photolabile Protecting Group ("Photomasked" Initiators)

Radical formation in steps by absorption of a first photon of the first wavelength $\lambda_1$ and of a second photon of the second wavelength $\lambda_2$ can also be achieved using photolabile protecting groups ("caged"). In this case, a photoinitiator with a protecting group is provided in the photoresist. The photoinitiator can only be excited once the protecting group has been separated off by irradiation.

One example of a compound with a photolabile protecting group is benzodioxine. This breaks down under irradiation with a first wavelength of 320 nm. Inter alia, benzophenone is produced as reaction product in this case. This can again be excited into the triplet ground state by irradiation at a second wavelength of 350 nm, as a result of which radical formation can be triggered.

3) Initiator Photosynthesized In Situ

According to a further embodiment, radicals can be generated in a two-stage process by in-situ photosynthesis of a photoinitiator. In this case, the photoresist comprises components which represent one or more reactants for synthesizing a photoinitiator. Photoinduced by irradiation with a first wavelength $\lambda_1$, a reaction is started which converts these reactants into a photoinitiator. By irradiation with a second wavelength $\lambda_2$, the synthesized photoinitiator is then excited, so that it forms a radical.

With this radical formation method, the at least one monomer of the photoresist should be inert to the reactants and the intermediate products of the synthesis of the photoinitiator.

Reactants for such in-situ photosynthesis of a photoinitiator may be for example 2,5-diphenyl-3,4-benzofuran or thioxanthone-anthracene.

2,5-diphenyl-3,4-benzofuran can be converted in a first step into 1,2-dibenzoyl benzene. In order to start this reaction, methylene blue can be used as a photosensitizer. Methylene blue can be excited with radiation of a first wavelength $\lambda_1$ of 632 nm, which can change 2,5-diphenyl-3,4-benzofuran into the triplet state, which thereupon changes into 1,2-dibenzoyl benzene. The latter can be excited by irradiation at a second wavelength $\lambda_2$ of 365 nm.

In the presence of oxygen and upon irradiation with a first wavelength $\lambda_1$ of 450 nm, thioxanthone-anthracene reacts to form a thioxanthone-anthracene endoperoxide. This breaks down into two radicals by irradiation at a second wavelength $\lambda_2$ of 400 nm.

4) Photochromic Compound

"Photochromism" according to the invention designates the property of a substance to change the absorption behavior under light radiation. The effect takes place in that a compound undergoes a reversible conversion between two isomers.

According to one embodiment, the photochromic property can be utilized in the present invention by switching a compound reversibly between a transparent and an absorbing state.

Examples of a photochromic compound are 2-methoxy naphthalene and spiropyrans.

2-methoxy naphthalene is a photochromic compound which in the cis state exhibits an absorption band at the wavelength 300 nm. After absorption of a photon of the first wavelength $\lambda_1$, the compound can switch into the trans state and in so doing form dimers. Alternatively, the compound can change into a triplet state and serve as a photosensitizer for exciting triplet states at a second wavelength $\lambda_2$ of 326 nm.

One example of a spiropyran which satisfies the above-mentioned properties is 1,3,3-trimethylindolino-6'-nitrobenzopyrylospiran. This is isomerized to form merocyanine upon irradiation with a first wavelength $\lambda_1$ in the blue or UV range. Merocyanine upon absorption of a photon of a second wavelength $\lambda_2$ in the visible range, for example 532 nm, changes into a reactive species which can bring about the hardening of the photoresist. The light-induced isomerization of spiropyran is reversible.

5) Quencher

According to the invention, "quenching" designates a process in which a fluorophore loses its fluorescent intensity. This occurs, for example, if a fluorophore which is in an excited state gives off its excitation energy to another molecule by means of an energy transfer. This energy transfer may take place for instance by impingement or dipole-dipole interactions. Dipole-dipole quenching takes place if the spectral emission band of the fluorophore and the absorption band of the quencher are superposed. For high efficiency of the energy transfer, the distance between the energy levels of the quencher and fluorophore must not be great. Preferably the spectral distance is less than 10 nm.

In the present invention, the above-mentioned mechanism can be utilized by a photoinitiator which has been excited with a photon of a first wavelength $\lambda_i$ but has not yet broken down into a radical being de-excited by a quencher compound, thus suppressing the radical formation. If the quencher compound is locally "switched off" by means of irradiation of a second wavelength $\lambda_2$, radicals can be formed by the photoinitiator.

6) pH-Sensitive Photoinitiator

In this embodiment of the present invention, the fact that photoinitiators frequently have a pH-dependent spectral shift of their absorption band is utilized. In this case, the pH value can be varied locally for example with a photoacid generator. The latter can form an acid upon being irradiated with a first wavelength $\lambda_1$. This acid shifts the absorption band of a photoinitiator such that it can absorb radiation of a second wavelength $\lambda_2$. In regions in which no acid has been formed by irradiation with the first wavelength $\lambda_1$, the photoinitiator absorbs light neither of wavelength $\lambda_1$ nor $\lambda_2$.

In one embodiment, the photoinitiator system comprises an α-diketone or a photochromic compound.

In the above-mentioned approaches 1) to 6), no virtual, short-lived energy levels of molecules are occupied. In this connection, "short-lived" means a life of less than 1 μs. For this reason, no light sources with high peak intensities are needed. In contrast to this, in two-photon lithography, a virtual intermediate level is used for absorbing two photons, which requires a greater peak intensity of a laser.

According to one embodiment of the method for additive manufacturing according to the invention, in step ii) single-photon absorption by the at least one photoinitiator system can take place. According to the invention, "single-photon absorption" designates absorption of one photon by a molecule. Furthermore, the term "two-photon absorption" means the simultaneous absorption of two photons by a molecule, the photons being absorbed within a few femtoseconds. In the present invention, two photons for excitation from state "G" to state "A" to state "R" (see FIG. 2) can on the other hand be absorbed in a time interval of a few picoseconds up to a few milliseconds.

For single-photon absorption, a considerably lower power per laser focus is necessary in contrast to two-photon absorption. Due to the lesser power requirement of the light source, the technical cost for carrying out the method can be reduced.

In one embodiment of the method for additive manufacturing according to the invention, after the step-wise building-up of the 3D-structured form a step of washing-out is carried out, in which non-hardened parts of the photoresist are removed.

A second aspect of the invention relates to a device for additive manufacturing of a 3D-structured form, starting from a liquid photoresist, comprising
  a first light source with a first wavelength $\lambda_1$,
  a second light source with a second wavelength $\lambda_2$, and
  a substrate for providing the liquid photoresist,
  wherein $\lambda_1 \neq \lambda_2$, and
  the first light source and the second light source are oriented toward the substrate in order to harden the liquid photoresist at the position which is irradiated by the first light source and the second light source with a time interval of less than 1 ms.

An example of the device for additive manufacturing according to the invention is shown in FIG. 1.

According to the invention, a "device for additive manufacturing" is to be understood to mean a device in which the 3D-structured form is built up in steps by hardening the liquid photoresist. This device for additive manufacturing is to be distinguished from a device for subtractive manufacturing, in which material is removed from a form.

The 3D-structured form fabricated in the device for additive manufacturing, the first light source with the first wavelength $\lambda_1$, the second light source with the second wavelength $\lambda_2$, the substrate for providing the liquid photoresist and the liquid photoresist correspond to the fabricated 3D-structured form, the first light source with the first wavelength $\lambda_1$, the second light source with the second wavelength $\lambda_2$, the substrate and the liquid photoresist of the method for additive manufacturing according to the invention.

In one embodiment of the device for additive manufacturing, the substrate is located in a container and the substrate is configured to support a 3D-structured form fabricated in the device for additive manufacturing. In this case, the container corresponds to the container of the method according to the invention. The substrate may be a stage or be mounted on a stage which corresponds to the stage of the method for additive manufacturing according to the invention.

The present invention permits efficient parallelization of the three-dimensional hardening of a liquid photoresist at high resolution. In addition, costs can be lowered compared with conventional two-photon lithography due to the reduction in the technical cost for implementing the invention, since in the present invention the excitation can take place by means of step-wise single-photon absorption.

The parallelization which the present invention provides makes it possible to produce 3D structurings with the aid of projection-based methods. Micromirror devices, which have a short switching time of only a few microseconds, can be used for a projection-based method of this type. Therefore an individual plane of the liquid photoresist can be irradiated and hardened within microseconds. In contrast, in conventional two-photon lithography frequently galvanometrically-driven mirrors are used, which typically take several milliseconds to irradiate a plane completely.

Compared with typical stereolithographic devices, the resolution axially to the projection of the 3D-structured form to be produced improves in the present invention. For conventional stereolithographic systems, minimum axial structure sizes of up to 10 μm are possible. In contrast to this, the present invention makes possible even finer structuring, which is even below the magnitude of the wavelength of the light sources used.

The following examples serve as further explanations of the present invention, without being restricted thereto.

Three photoresists were investigated. The photoresists are composed as indicated in Table 1.

| Photoresist | Monomer | Photoinitiator system |
|---|---|---|
| 1 | PETA 99 wt. % | Diacetyl 1 wt. % |
| 2 | PETA 99 wt. % | 1,3,3-trimethylindolino-6'-nitrobenzopyrylospiran 1 wt. % |
| 3 | PETA 99 wt. % | Benzil 1 wt. % |

Figure 3:
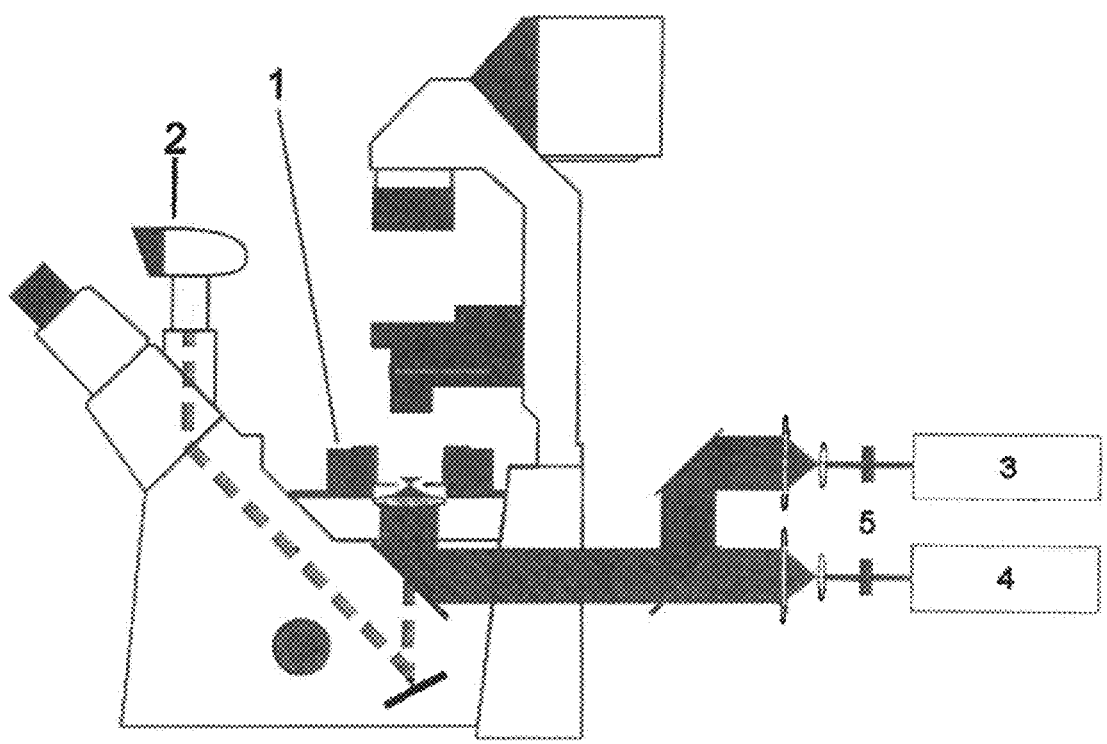
FIG. 3 shows a diagrammatic representation of the structure for characterizing a photoresist with examples of lasers.

Pentaerythritol triacrylate (PETA): CAS 3524-68-3
Diacetyl: CAS 431-03-8
1,3,3-trimethylindolino-6'-nitrobenzopyrylospiran: CAS 1498-88-0
Benzil: CAS 134-81-6
The structure is diagrammatically illustrated in FIG. 3.
The following:
a continuous-wave laser with a wavelength of 440 nm, 3 in FIG. 3, and
a continuous-wave laser with a wavelength of 640 nm, 4 in FIG. 3,
were selected as light sources for photoresist 1. For photoresist 2 and photoresist 3,
a pulsed laser with a wavelength of 405 nm with a pulse duration of 200 fs and a repetition rate of 80 MHz and
a laser with a wavelength of 532 nm in continuous-wave mode
were selected. The average intensity of the respective lasers was matched to the respective photoinitiator system.

For photoresist 1, the intensity in the focus of the laser with the wavelength of 440 nm was set to a maximum of 130 W/cm². The intensity of the laser with the wavelength of 640 nm was a maximum of 690 W/cm².

For photoresist 2, the intensity of the laser with the wavelength of 405 nm was set to a maximum of 260 W/cm². The intensity of the laser with the wavelength of 532 nm was a maximum of 96 kW/cm².

For photoresist 3, the intensity of the laser with the wavelength of 405 nm was set to a maximum of 16 W/cm². The intensity of the laser with the wavelength of 532 nm was a maximum of 48 kW/cm².

An acousto-optic modulator (5 in FIG. 3) was used for the intensity modulation.

The outputs were measured in each case in the plane of the microscope objective pupil and converted into intensities using a measurement of the width of the focused beam.

Both laser beams were enlarged, superimposed with the aid of a beam splitter and guided into a microscope objective (100×, NA 1.4, oil immersion). The lasers were focused by a microscope cover glass (170 μm thick) into a drop of the respective photoresist. The cover glass was moved spatially by means of a piezo-stage (1 in FIG. 3). With the aid of a digital camera (2 in FIG. 3), the hardening operation in the focal plane could be tracked in real time. Three series of measurements were carried out.

1st Series of Measurements:
In the 1st series of measurements, the intensity of the 440 nm laser was varied in a range from 0 to 130 W/cm² and the 640 nm laser was blocked. The intensity of the 440 nm laser was gradually increased. The photoresist did not harden in this range (see FIGS. 4a and 4b, left).

2nd series of Measurements:
In a 2nd series of measurements, the beam of the 440 nm laser was blocked and the intensity of the 640 nm laser was gradually increased in a range from 0 to 690 W/cm². The photoresist did not harden in this range (see FIGS. 4a and 4b, middle).

3rd Series of Measurements:
In the 3rd series of measurements, the intensity of the 640 nm laser was increased linearly up to 690 W/cm², whereas the 440 nm laser was operated constantly at maximum intensity (130 W/cm²). It was shown that the photoresist 1 hardened at a threshold value of $I_{1A}$=185 W/cm² (see FIGS. 4a and 4b, right).

Figure 4A:
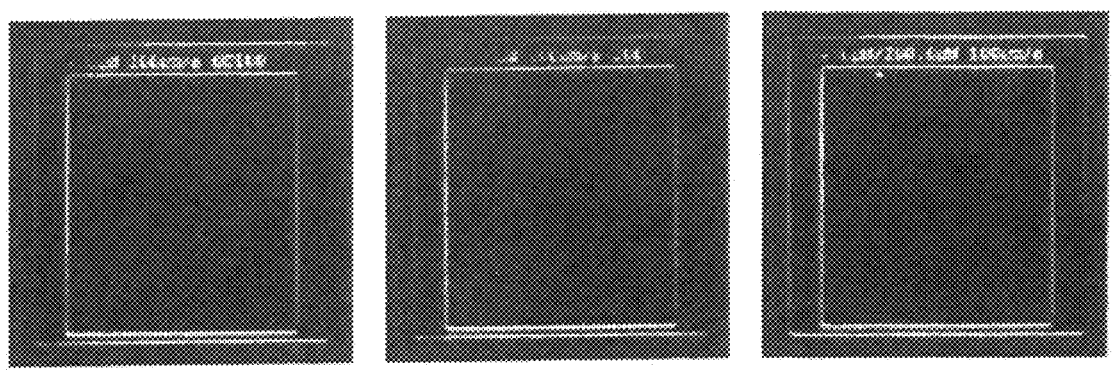
FIG. 4a shows microscope images of the experiments with the photoresist 1 which were carried out. Along the horizontal axis, the z-coordinate of the focal plane was varied, and the intensity of a laser was varied along the vertical axis. Left: the laser at 640 nm was blocked, the intensity of the 440 nm laser was varied from 0 to 130 W/cm$^2$. Centre: the laser at 440 nm was blocked, the intensity of the 640 nm laser was varied from 0 to 690 W/cm$^2$. Right: the laser at 440 nm was operated at a constant 130 W/cm$^2$. The intensity of the 640 nm laser was varied as previously.
Figure 4B:
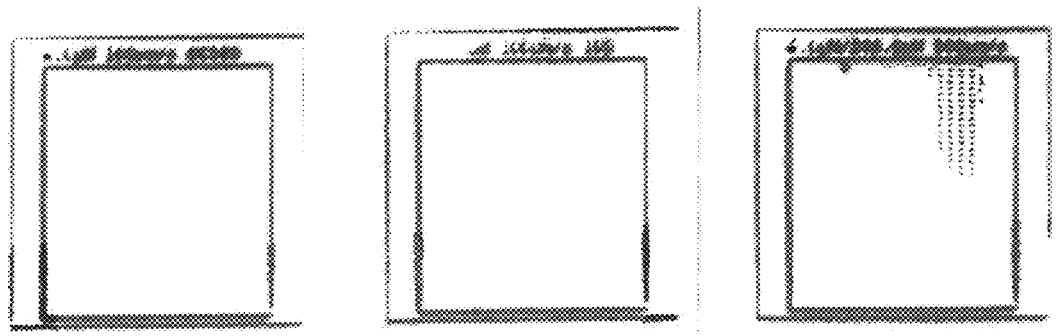
FIG. 4b shows the corresponding color-inverted microscope images.

Microscope images of the three series of measurements for photoresist 1 are shown in FIGS. 4a and 4b. The intensity was varied along the vertical in the images. In this case, the lower end of the image corresponds to an intensity of 0 W/cm² and the upper end to the respective maximum value.

Experiments for the photoresist 2 and photoresist 3 with the corresponding lasers yield similar results (not shown).

It can be recognized that the threshold for hardening the photoresist is reached if irradiation is carried out simultaneously with the 640 nm laser and the 440 nm laser, as shown for the 3rd series of measurements in FIGS. 4a and 4b.

In the 1st series of measurements and the 2nd series of measurements, no hardening of the photoresist was exhibited in the range illustrated.

The invention claimed is:

1. A method for additive manufacturing of a 3D-structured form, the method comprising the steps of:
    i) providing a liquid photoresist comprising at least one monomer and at least one photoinitiator system comprising an α-diketone or a photochromic compound selected from the group consisting of 2-methoxy naphthalene and spiropyrans; and
    ii) irradiating the liquid photoresist with a first light source at a first wavelength λi and with a second light source at a second wavelength λ2 either simultaneously or sequentially with a time interval of less than 1 ms to harden the liquid photoresist and produce the 3D-structured form,
    wherein $\lambda_1 \neq \lambda_2$, and
    wherein the hardening of the liquid photoresist to produce the 3D-structured form takes place only at the position which is irradiated by the first light source and the second light source either simultaneously or sequentially with the time interval of less than 1 ms.

2. The method according to claim 1,
    wherein in step ii), a single-photon absorption by the at least one photoinitiator system takes place.

3. The method according to claim 1,
    wherein in step ii), the 3D-structured form to be produced is imaged into at least one of the focal planes of the first light source and of the second light source.

4. The method according to claim 1, wherein the liquid photoresist in step i) is provided in a container, wherein a substrate which supports the 3D-structured form is located in the container.

5. A device for additive manufacturing of a 3D-structured form, starting from a liquid photoresist, the device comprising:
   a first light source with a first wavelength $\lambda_1$;
   a second light source with a second wavelength $\lambda_2$; and
   a substrate configured for providing the liquid photoresist,
   the liquid photoresist comprising at least one monomer and at least one photoinitiator system comprising an α-diketone or a photochromic compound selected from the group consisting of 2-methoxy naphthalene and spiropyrans,
   wherein $\lambda_1 \neq \lambda_2$, and
   wherein the first light source and the second light source are configured to be oriented toward the substrate and are configured to irradiate the liquid photoresist either simultaneously or sequentially with a time interval of less than 1 ms in order to harden the liquid photoresist only at the position which is irradiated by the first light source and the second light source either simultaneously or sequentially with the time interval of less than 1 ms.

6. The device according to claim 5, wherein the substrate is located in a container and the substrate is further configured to support a 3D-structured form fabricated in the device for additive manufacturing.

7. The device according to claim 5,
   wherein a direction of irradiation of the first light source is different from a direction of irradiation of the second light source.

8. The device according to claim 5,
   wherein the first light source and the second light source are lasers.

9. The device according to claim 8,
   wherein at least one of the lasers is a pulsed laser.

10. The method according to claim 1,
    wherein the direction of irradiation of the first light source is different from the direction of irradiation of the second light source.

11. The method according to claim 1,
    wherein the first light source and the second light source are lasers.

12. The method according to claim 11,
    wherein at least one of the lasers is a pulsed laser.

13. The method according to claim 1, wherein after step ii), further comprising step (iii) removing non-hardened liquid photoresist.

* * * * *